United States Patent
Dias da Fonte et al.

(10) Patent No.: US 7,423,481 B2
(45) Date of Patent: Sep. 9, 2008

(54) AMPLIFIER ARRANGEMENT AND AMPLIFYING METHOD

(75) Inventors: Victor Dias da Fonte, Neubiberg (DE); Markus Schimper, Moosinning (DE)

(73) Assignee: Infineon Technologies AG, Munich (DE)

( * ) Notice: Subject to any disclaimer, the term of this patent is extended or adjusted under 35 U.S.C. 154(b) by 126 days.

(21) Appl. No.: 11/436,805

(22) Filed: May 18, 2006

(65) Prior Publication Data

US 2006/0284680 A1    Dec. 21, 2006

(30) Foreign Application Priority Data

May 18, 2005 (DE) ........................ 10 2005 022 837
Aug. 1, 2005 (DE) ........................ 10 2005 036 100

(51) Int. Cl.
*H03F 1/36* (2006.01)
(52) U.S. Cl. ........................................ 330/86; 330/254
(58) Field of Classification Search .................. 330/86, 330/51, 254, 260
See application file for complete search history.

(56) References Cited

U.S. PATENT DOCUMENTS

| 4,551,685 | A  |   | 11/1985 | Kerns, Jr. et al. |
|-----------|----|---|---------|-------------------|
| 5,999,052 | A  | * | 12/1999 | Tang .......................... 330/254 |
| 6,545,534 | B1 | * | 4/2003  | Mehr ........................... 330/69 |
| 6,570,448 | B1 | * | 5/2003  | Sobel .......................... 330/254 |
| 6,621,343 | B2 | * | 9/2003  | Hart ............................ 330/254 |
| 6,693,491 | B1 | * | 2/2004  | Delano ....................... 330/282 |
| 6,958,654 | B2 | * | 10/2005 | Sobel .......................... 330/282 |
| 7,068,108 | B2 | * | 6/2006  | Xu et al. ..................... 330/284 |
| 7,098,733 | B1 | * | 8/2006  | Lokere ....................... 330/147 |

* cited by examiner

*Primary Examiner*—Henry K Choe
(74) *Attorney, Agent, or Firm*—Eschweiler & Associates, LLC

(57) ABSTRACT

In one embodiment, an amplifier arrangement includes an amplifier having a first input, a second input and an output, a first resistor network, having a first parallel circuit formed by a first number N of resistors, and a second resistor network, having a first resistor or a second parallel circuit formed by a second number M of resistors. The resistors of the first and second resistor networks each have approximately the same nominal value, an approximately identical width W and an approximately identical length L of a resistive layer. The first and second resistor networks are coupled to the amplifier.

32 Claims, 9 Drawing Sheets

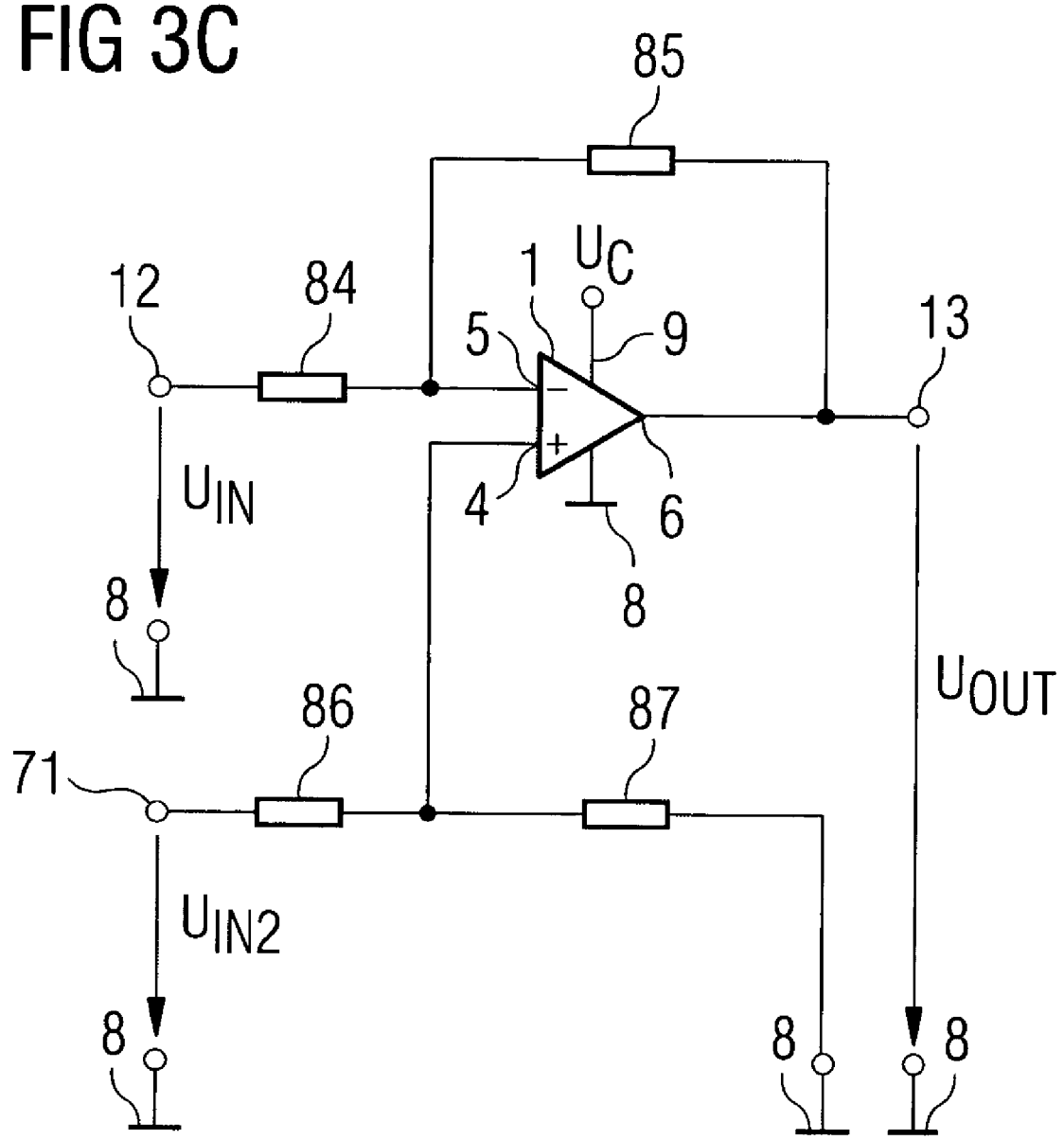

US 7,423,481 B2

AMPLIFIER ARRANGEMENT AND AMPLIFYING METHOD

REFERENCE TO RELATED APPLICATIONS

This application claims the benefit of the priority dates of German applications DE 10 2005 022 837.2, filed on May 18, 2005 and DE 10 2005 036 100.5 filed on Aug. 1, 2005, the contents of which are herein incorporated by reference in their entirety.

FIELD OF THE INVENTION

The present invention relates to the field of electronics, and primarily to an amplifier arrangement comprising a first and second resistor network, and to a method for amplifying a voltage.

BACKGROUND OF THE INVENTION

Amplifier arrangements are used in a number of areas of electronics such as, for example, communications technology and industrial electronics. An amplifier arrangement may be produced as an individual integrated circuit. An amplifier arrangement may also be realized together with further circuit modules on an extensive integrated circuit, however.

FIGS. 1A to 1D show customary amplifier arrangements in accordance with the principle of the inverting amplifier. Functionally or operatively identical structural elements bear identical reference symbols.

FIG. 1A shows an amplifier 1 having a first input 4, a second input 5 and an output 6. The first input 4 is embodied as a noninverting input and the second input 5 is embodied as an inverting input. The amplifier 1 is connected to a supply voltage terminal 9 and a reference potential terminal 8 for provision of a supply voltage $U_C$. The output 6 of the amplifier 1 thus drives a voltage that is a function of the difference between a voltage at the first input 4 and a voltage at the second input 5.

The output 6 is connected to the second input 5 of the amplifier 1 by means of a feedback resistor 31. An input 12 of the amplifier arrangement is connected to the second input 5 of the amplifier 1 via an input resistor 30. The input 12 of the amplifier arrangement serves for feeding in an input voltage $U_{IN}$ to be amplified. The output 6 of the amplifier 1 is connected to an output 13 of the amplifier arrangement for outputting an output voltage $U_{OUT}$. The first input 4 of the amplifier 1 is connected to the reference potential terminal 8.

The gain factor G of the inverting amplifier depends on the ratio of the value of the input resistor 30 to the value of the feedback resistor 31. The gain factor G can be calculated approximately from the following equation:

$$G = \frac{U_{OUT}}{U_{IN}} = -\frac{R_{31}}{R_{30}},$$

where $U_{IN}$ is the input voltage, $U_{OUT}$ is the output voltage, $R_{30}$ is the value of the input resistor 30 and $R_{31}$ is the value of the feedback resistor 31.

FIG. 1B shows an amplifier arrangement which largely corresponds to the amplifier arrangement of FIG. 1A. Instead of the feedback resistor 31 in the amplifier arrangement in accordance with FIG. 1A, in the amplifier arrangement in accordance with FIG. 1B four feedback resistors 32, 33, 65, 66 are connected in series between the output 6 of the amplifier 1 and the second input 5 of the amplifier 1.

The input resistor 30 and the four feedback resistors 32, 33, 65, 66 have the same nominal value. Therefore, the gain factor G of the amplifier arrangement in accordance with FIG. 1B is approximately −4.

FIG. 1C shows an amplifier arrangement which is constructed in a development of the amplifier arrangement in FIG. 1B. A resistor network connects the output 6 of the amplifier 1 to the second input 5 of the amplifier 1 and comprises four feedback resistors 34, 35, 36, 37 connected in series. A first terminal of the feedback resistor 34 is connected to the second input 5 of the amplifier 1 via a switch $S_{31}$. A node formed between the feedback resistor 34 and the feedback resistor 35 is connected to the second input 5 of the amplifier 1 via a switch $S_{32}$. Likewise, a node between the feedback resistor 35 and the feedback resistor 36 and a node between the feedback resistor 36 and the feedback resistor 37 are connected to the second input 5 of the amplifier 1 by means of a respective switch $S_{33}$, $S_{34}$.

If the switch $S_{34}$ is closed, then the magnitude of the gain factor G is the ratio of the value of the feedback resistor 37 to the value of the input resistor 30. A gain factor G of maximum magnitude can be set in the amplifier arrangement in accordance with FIG. 1C if the switch $S_{31}$ is closed and the three switches $S_{32}$, $S_{33}$, $S_{34}$ are open.

FIG. 1D shows an amplifier arrangement which is constructed in a development of the amplifier arrangement in accordance with FIG. 1C. Eight resistors having the same nominal value as the input resistor 30 are provided as feedback resistors 38, 39, 40, 41, 42, 43, 44, 45.

As a result of the switch $S_{34}$ being closed, the gain factor G can be set approximately to a value of −1. As a result of the switch $S_{33}$ being closed, the gain factor G can be set approximately to −2; as a result of the switch $S_{32}$ being closed, the gain factor G can be set approximately to −4; and as a result of the switch $S_{31}$ being closed the gain factor G can be set approximately to −8.

The absolute values of resistors having different nominal values may be subject to great fluctuations on account of diverse influences, particularly during production in integrated circuit technology. It can happen, therefore, that in the amplifier arrangements in accordance with FIGS. 1A and 1C, the gain factor can be set only with limited accuracy on account of the great variation of the values of the resistors.

Since the resistors have the same nominal value in the amplifier arrangements in accordance with FIGS. 1B and 1D, the factors responsible for the fluctuations are reduced and a higher accuracy of the gain factor G is to be expected. An area requirement for the realization of the multiplicity of resistors may be high, however, in the amplifier arrangements in accordance with FIGS. 1B and 1D.

An amplifier arrangement should enable an accurate setting of the gain factor and an area-saving realization of the amplifier arrangement. A method for amplifying a voltage should provide an amplified voltage having a gain factor that can be set.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

In one embodiment, an amplifier arrangement comprises an amplifier having a first input, a second input and an output, a first resistor network, comprising a first parallel circuit formed by a first number N of resistors, and a second resistor network, comprising a first resistor or a second parallel circuit formed by a second number M of resistors. The resistors of the first and second resistor networks each comprise the same nominal value, an approximately identical width W and an approximately identical length L of a resistive layer. The first and second resistor networks are coupled to the amplifier.

In another embodiment, an amplifier arrangement comprises an amplifier having a first input, a second input and an output, a first resistor network, which comprises a first parallel circuit formed by a first number N of resistors and a first total resistance value $R_1$, and a second resistor network, which comprises a first resistor or a second parallel circuit formed by a second number M of resistors and also comprises a switch and a second total resistance value $R_2$. The resistors of the first and second resistor networks each comprise the same nominal value. The first and second resistor networks are coupled to the amplifier.

In a further embodiment, an amplifier arrangement comprises an amplifier, a first resistor network, comprising a first parallel circuit formed by a first number N of resistors, and a second resistor network, comprising a first resistor or a second parallel circuit formed by a second number M of resistors. The resistors of the first and second resistor networks comprise an approximately identical width W and an approximately identical length L of a resistive layer. The first and second resistor networks are coupled to the amplifier for the purpose of setting the gain factor of the amplifier arrangement.

In an alternative embodiment, an amplifier arrangement comprises an amplifier, a first resistor network, comprising a first parallel circuit formed by a first number N of resistors, and a second resistor network, comprising a first resistor or a second parallel circuit formed by a second number M of resistors. The first and second resistor networks are coupled to the amplifier in such a way that the gain factor of the amplifier arrangement is set in a manner dependent on the ratio of the second total resistance value $R_2$ to the first total resistance value $R_1$.

In one embodiment, a method for amplifying a voltage is provided, comprising applying an input voltage to an input of an amplifier arrangement coupled via a first resistor network, comprising a first parallel circuit formed by a first number N of resistors, to a second input of an amplifier, which forms an inverting input of the amplifier. A second resistor network couples the second input of the amplifier to an output of the amplifier and comprises a first resistor or a second parallel circuit formed by a second number M of resistors, the resistors of the first and second resistor networks each comprising the same nominal value, an approximately identical width W and an approximately identical length L of a resistive layer. The method comprises a step of tapping off an output voltage at an output of the amplifier arrangement, said output being coupled to an output of the amplifier.

In a further embodiment, a method for amplifying a voltage comprises the steps of applying an input voltage to an input of an amplifier arrangement coupled via a first resistor network, comprising a first parallel circuit formed by a first number N of resistors, to a second input of an amplifier, which forms an inverting input of the amplifier. A second resistor network couples the second input of the amplifier to an output of the amplifier and comprises the following branches connected in parallel with one another, namely a series circuit comprising a first switch and a first resistor or a second parallel circuit formed by a second number M of resistors, and at least one further series circuit comprising at least one second switch and at least one third parallel circuit formed by a third number L of resistors. The resistors of the first and second resistor networks each comprise the same nominal value. The method further comprises the steps of setting the first switch and the at least one second switch of the second resistor network in a manner dependent on at least one control signal, and tapping off an output voltage at an output of the amplifier arrangement, said output being coupled to an output of the amplifier.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

The invention is explained in more detail below using a plurality of exemplary embodiments with reference to the figures. Functionally or operatively identical structural elements bear identical reference symbols.

FIGS. 3A to 3C show further amplifier arrangements in which a first and a second resistor network can be employed according to another embodiment of the invention.

DETAILED DESCRIPTION OF THE INVENTION

FIGS. 1A to 1D show exemplary embodiments of a customary inverting amplifier arrangement. FIGS. 1A to 1D have been explained in the introduction to the description, and so the explanation will not be repeated at this juncture.

Figure 2A:
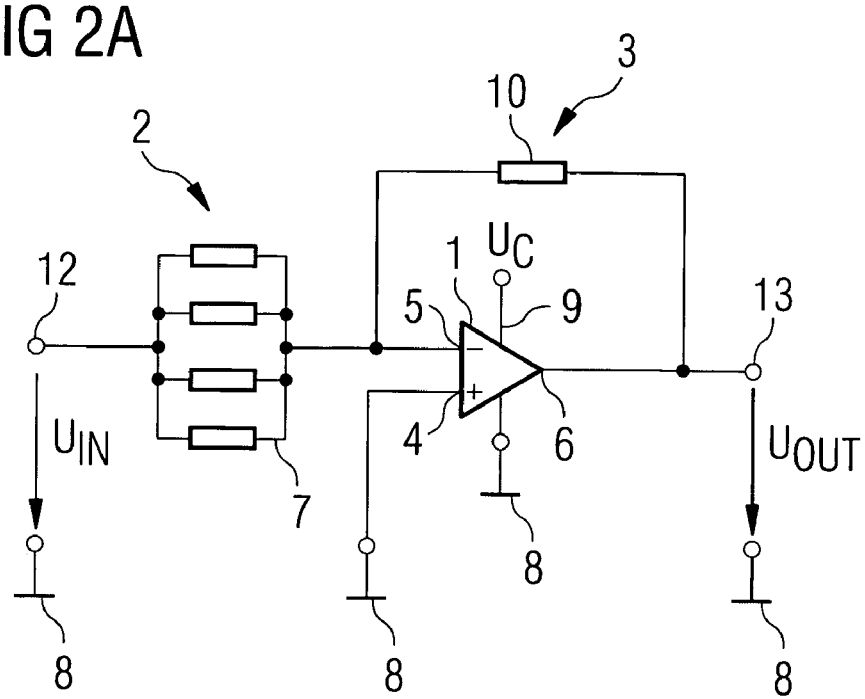
FIGS. 2A to 2D show exemplary amplifier arrangements of an inverting amplifier according to one embodiment of the invention.

FIG. 2A shows an exemplary embodiment of an inverting amplifier arrangement according to one embodiment of the invention. The amplifier arrangement comprises an amplifier 1 having a first input 4, which is formed in noninverting fashion, a second input 5, which is formed in inverting fashion, and an output 6. The second input 5 of the amplifier 1 is connected to an input 12 of the amplifier arrangement via a first resistor network 2. The input 12 of the amplifier arrangement serves for feeding in the signal to be amplified, the input voltage $U_{IN}$. The second input 5 of the amplifier 1 is connected to the output 6 of the amplifier 1 via a first or feedback resistor 10. The output 6 of the amplifier 1 is in turn linked to the output 13 of the amplifier arrangement, at which the amplified signal, the output voltage $U_{OUT}$, can be tapped off. The amplifier 1 is connected to a supply voltage terminal 9 and a reference potential terminal 8 for providing a supply voltage $U_C$. The amplifier 1 is connected to a reference potential terminal 8 at its first input 4.

The first resistor network 2 comprises a first parallel circuit 7 comprising four resistors. The four resistors of the first parallel circuit 7 and the first resistor 10 each comprise the same nominal value.

The gain factor G of the amplifier arrangement in accordance with FIG. 2A has a value of approximately −4. The magnitude of the output voltage $U_{OUT}$ is thus approximately quadruple the magnitude of the input voltage $U_{IN}$.

Figure 1A:
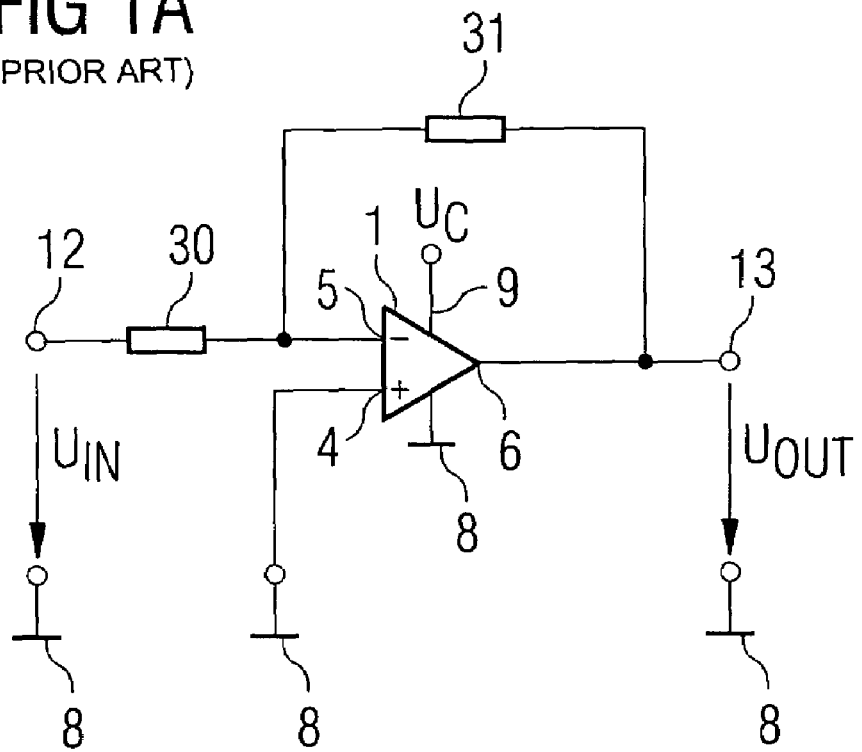
FIGS. 1A to 1D show exemplary embodiments of a customary inverting amplifier arrangement.
Figure 1B:
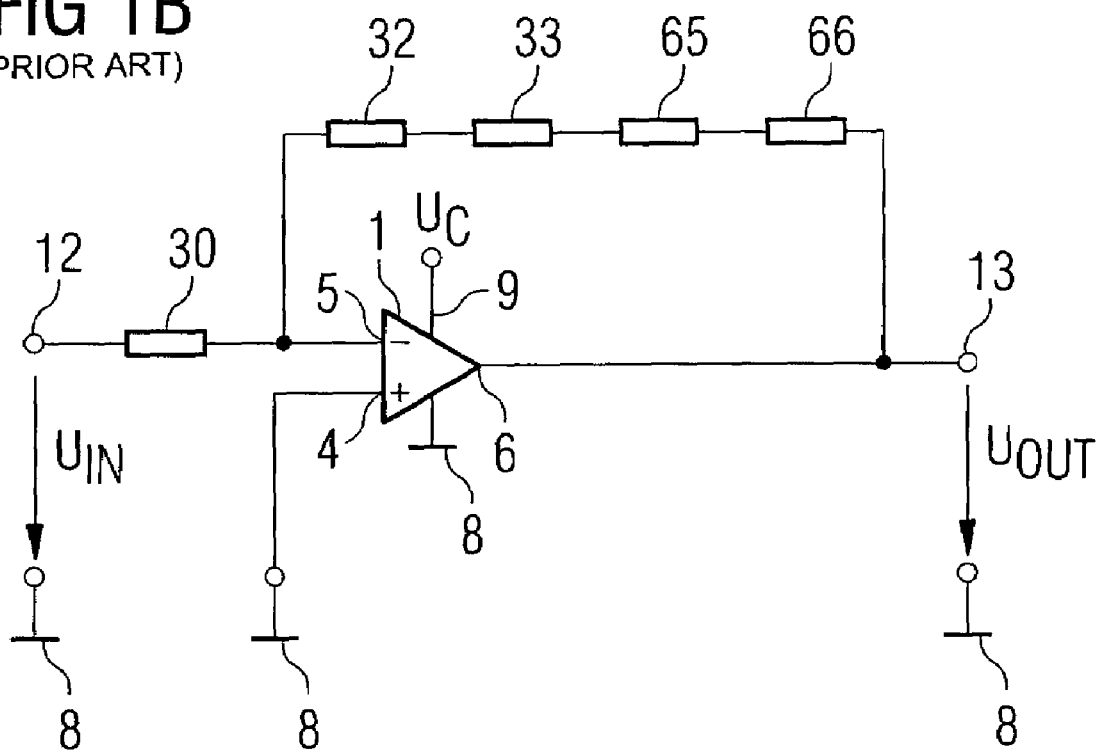
Figure 1C:
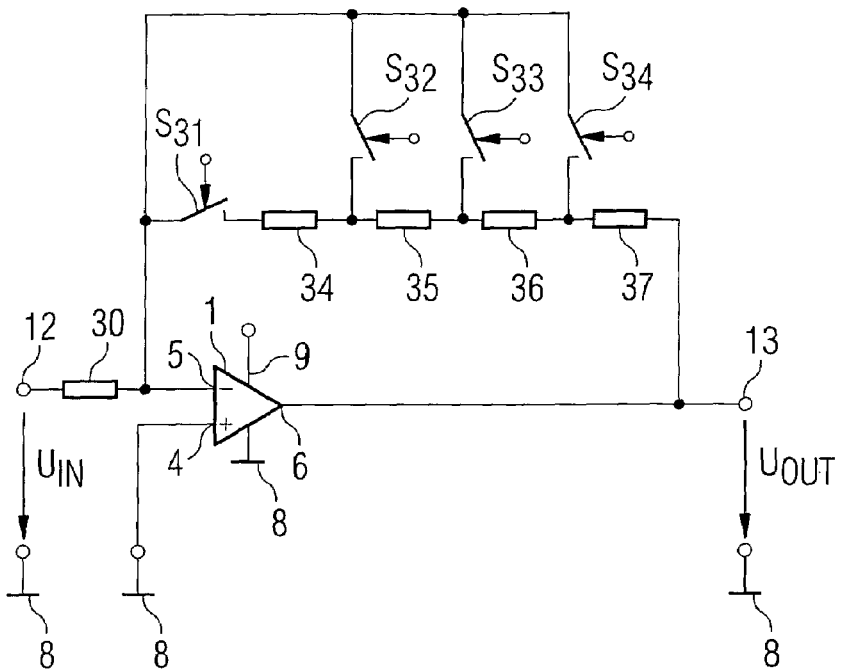

The amplifier arrangement in accordance with FIG. 2A thus has the same value of the gain factor as the customary or prior art amplifier arrangement in accordance with FIG. 1B. Resistors having the same nominal value are in each case established in both amplifier arrangements.

One advantage of the amplifier arrangement in accordance with FIG. 2A is that the resistors forming the first parallel circuit 7 can be embodied in a manner that saves more area than the four resistors 32, 33, 65, 66 connected in series in the amplifier arrangement in accordance with FIG. 1B. The reason for this is that the four resistors are at the same potential at their respective first terminal and at their respective second terminal, so that no potential differences occur between the spatially adjacent segments of the resistors. Therefore, the distances between the four resistors can be kept very small. This is not the case with the four resistors 32, 33, 65, 66 in the amplifier arrangement in accordance with FIG. 1B.

Figure 2B:
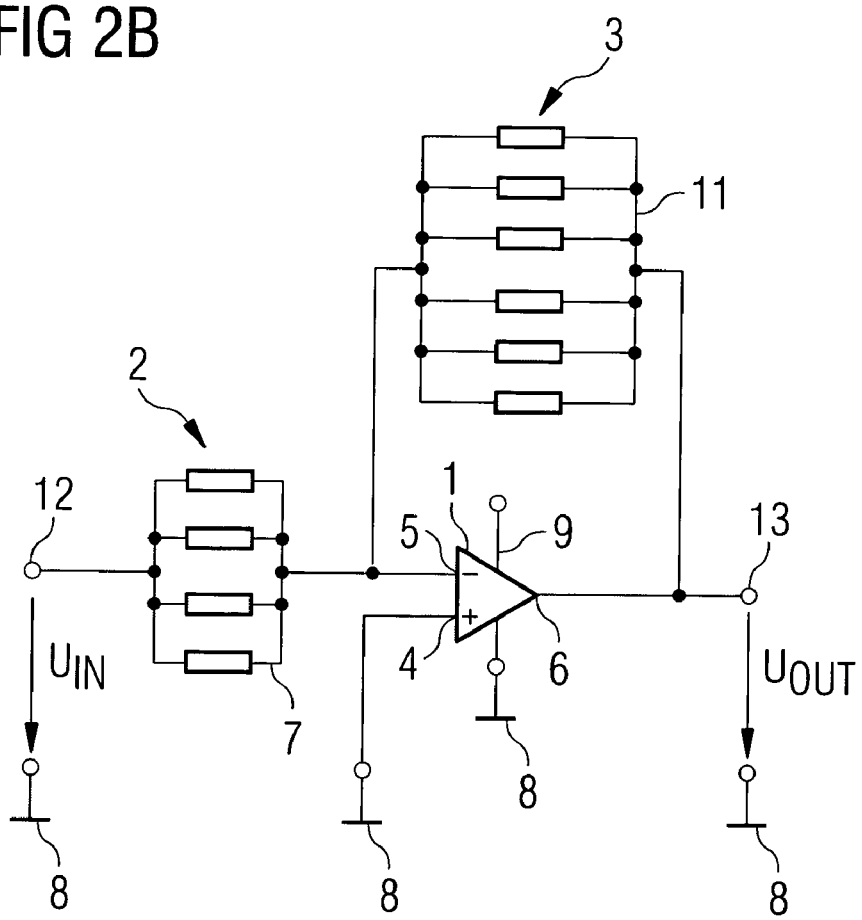

FIG. 2B shows a further embodiment of an inverting amplifier arrangement in accordance with the invention, which is constructed analogously to FIG. 2A. In contrast to the amplifier arrangement in accordance with FIG. 2A, in the amplifier arrangement in accordance with FIG. 2B a second resistor network 3, comprising a parallel circuit 11 formed by six resistors, is connected between the output 6 of the amplifier 1 and the second input 5 of the amplifier 1.

The six resistors of the second parallel circuit 11 and the four resistors of the first parallel circuit 7 comprise the same nominal value. The gain factor G of the amplifier arrangement in accordance with FIG. 2B has a value of approximately −4/6. The magnitude of the output voltage $U_{OUT}$ is thus approximately 2/3 of the magnitude of the input voltage $U_I$.

One advantage of the amplifier arrangement in accordance with FIG. 2B, comprising two parallel circuits 7, 11, is that the gain factor G has a very low variation on account of the multiplicity of resistors having the same nominal value that are used. The variation is lower than would be a variation of the gain factor G of an amplifier arrangement in which the first parallel circuit 7 is combined to form a single resistor and the second parallel circuit 11 is likewise combined to form a further single resistor.

Figure 2C:
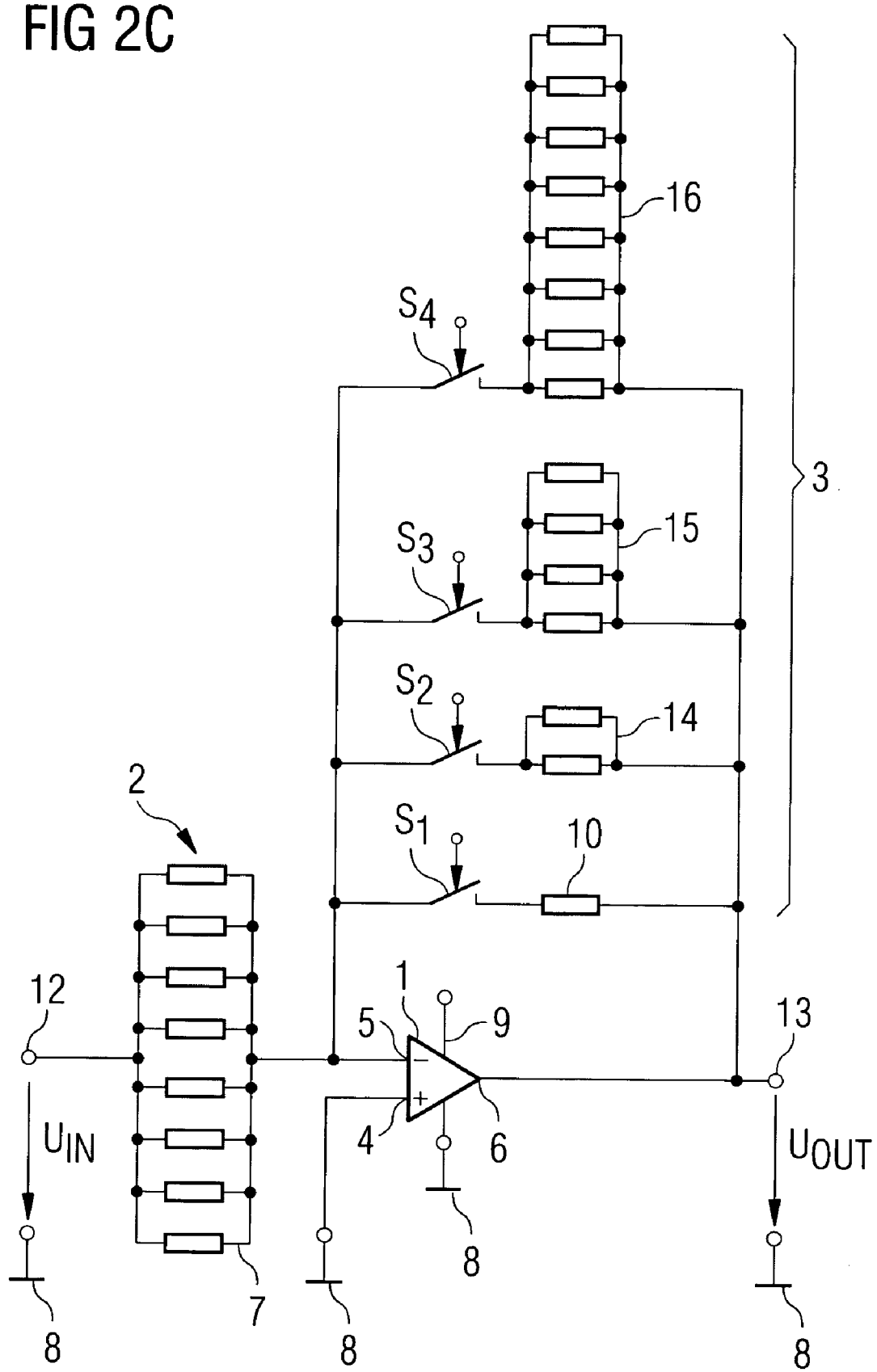

FIG. 2C shows a further exemplary embodiment of an amplifier arrangement according to the invention, which constitutes a development of the amplifier arrangement in accordance with FIGS. 2A and 2B.

The second input 5 of the amplifier 1 is connected to the input 12 of the amplifier arrangement via the first resistor network 2, comprising eight resistors connected in parallel in this embodiment. The second input 5 of the amplifier 1 is furthermore connected to the output 6 of the amplifier 1 via the second resistor network 3, comprising a parallel circuit formed by four series circuits in this embodiment.

One of the series circuits comprises the first resistor 10 and a first switch $S_1$. A further series circuit comprises a parallel circuit 14 comprising two resistors and a second switch $S_2$. A further series circuit comprises a parallel circuit constructed from four resistors and a switch $S_3$. A further series circuit comprises a parallel circuit 16 comprising eight resistors and a switch $S_4$. The resistors in the first and second resistor networks 2, 3 each comprise the same nominal value.

If the switch $S_4$ is closed and the switches $S_3$, $S_2$, $S_1$ are open, then the gain factor G of the arrangement is approximately −1. As a result of the switch $S_4$ being opened and the switch $S_3$ being closed, the gain factor is set to a value of approximately −2. As a result of the further second switch $S_3$ being opened and the further second switch $S_2$ being closed, approximately −4 can be set as the value of the gain factor. The closing of the first switch $S_1$ and the opening of the second switch and of the switches $S_2$, $S_3$, $S_4$ produces a gain factor value of approximately −8.

If a plurality of switches from the set of four switches $S_1$, $S_2$, $S_3$, $S_4$ are closed, then other values for the gain factor G can thereby also be set. With the amplifier arrangement in accordance with FIG. 2C, it is possible to set different discrete values of the gain factor G from approximately −8/15 to −8. The number of resistors in FIG. 2C is only an exemplary embodiment. It is also possible to realize other values for the gain factor G by means of a different number of resistors in the parallel circuits 14, 15, 16 or by means of additional series circuits, comprising a switch and a parallel circuit of resistors.

In this amplifier arrangement, the maximum variation of the gain factor divided by the gain factor results in the case of a closed first switch $S_1$. Consequently, in one example of the design of the amplifier arrangement in accordance with FIG. 2C, the first resistor 10 which comprises the same nominal value as all the other resistors in the first and second resistor networks 2, 3 is designed such that a predetermined variation for the relative gain factor, that is to say the variation of the gain factor divided by the value of the gain factor, is not exceeded.

Consequently, it is ensured in this exemplary embodiment that the relative variation remains below the predetermined value for a relative variation given the selection of the values −4, −2 and −1 for the gain factor G.

The reason for this is that on account of the high number of resistors having the same nominal value and since the variation of the ratio of two resistors is statistically independent of the variation of the ratio of two other resistors having the same nominal value, overall a very low relative variation of the value of the gain factor G occurs.

Conversely, given a predetermined relative variation of the gain factor, the resistors of the arrangement in accordance with the present invention can be realized on a smaller area compared with the resistors in known arrangements.

Figure 1D:
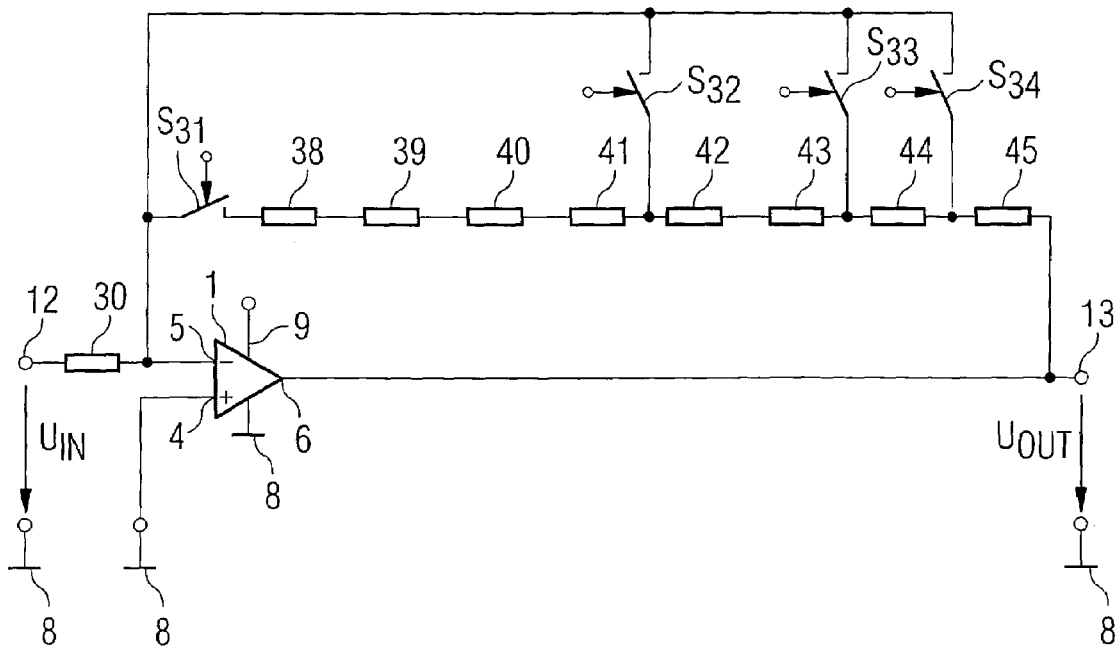

The amplifier arrangement in accordance with FIG. 2C yields the same gain factors as the amplifier arrangement in prior art FIG. 1D. In order to obtain a small relative variation of the gain factor in the amplifier arrangement in accordance with FIG. 1D, the input resistor 30 and the feedback resistor 45 have to be chosen to be very large.

The amplifier arrangement in accordance with prior art FIG. 1D comprises 9 resistors, while the amplifier arrangement in accordance with FIG. 2C contains 23 resistors. Since the resistors can be designed to be smaller in the amplifier arrangement in accordance with FIG. 2C than in the amplifier arrangement in accordance with FIG. 1D, a smaller area requirement for the realization of the network in the amplifier arrangement in accordance with FIG. 2C can advantageously be achieved despite the higher number of resistors in the amplifier arrangement in accordance with FIG. 2C.

In an alternative embodiment (not shown), the second parallel circuit 11 may be provided instead of the first resistor 10, said second parallel circuit being shown in an exemplary embodiment in FIG. 2B.

Figure 2D:
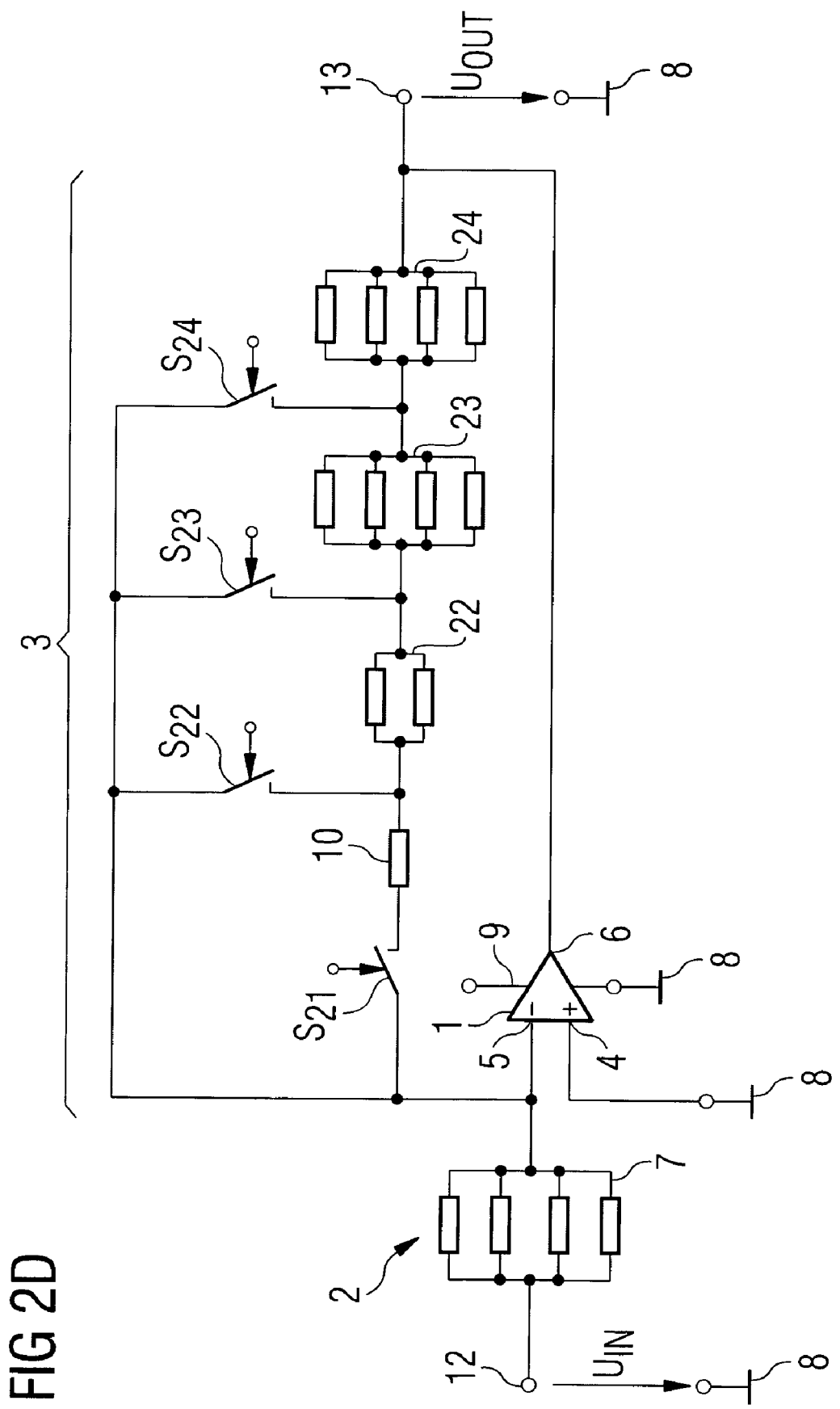

FIG. 2D shows a further exemplary amplifier arrangement having an inverting amplifier according to another embodiment of the invention. The amplifier arrangement in accordance with FIG. 2D is constructed analogously to the amplifier arrangement in FIG. 2A. In this exemplary embodiment, the second resistor network 3 connected between the output 6 of the amplifier 1 and the second input 5 of the amplifier 1 is formed from a series circuit formed by a third switch $S_{21}$, the first resistor 10, a fourth parallel circuit 22, comprising two resistors, a further fourth parallel circuit 23, comprising four resistors, and a further fourth parallel circuit 24, comprising four resistors.

A first terminal of the third switch S21 is connected to the second input 5 of the amplifier 1. A node formed between the first resistor 10 and the fourth parallel circuit 22 is likewise connected to the second terminal 5 of the amplifier 1 by means of a fourth switch $S_{22}$. Analogously to this, a further node situated between the parallel circuit 22 and the further fourth parallel circuit 23 is connected to the second input 5 of the amplifier 1 by means of a further fourth switch $S_{23}$. A node situated between the further fourth parallel circuit 23 and the further fourth parallel circuit 24 is linked to the second input 5 of the amplifier 1 via a further fourth switch $S_{24}$.

The second input 5 of the amplifier 1 is connected to the input 12 of the amplifier arrangement by means of a first parallel circuit 7, comprising four resistors.

If the further fourth switch $S_{24}$ is closed then the value of the gain factor G of the amplifier arrangement in accordance with FIG. 2D is approximately −1. As a result of the further fourth switch $S_{24}$ being opened and the further fourth switch $S_{23}$ being closed, the magnitude of the gain factor of the arrangement increases to approximately −2. If the further fourth switches $S_{23}$, $S_{24}$ are opened and the fourth switch $S_{22}$ is closed, then the amplifier arrangement is designed to amplify the input voltage $U_{IN}$ with a gain factor of approximately −4. The closing of the third switch $S_{21}$ and the opening of the three fourth switches $S_{22}$, $S_{23}$, $S_{24}$ bring about a gain factor of approximately −8.

Like the amplifier arrangement in accordance with prior art FIG. 1D, the amplifier arrangement in accordance with FIG. 2D comprises a series circuit for coupling the output 6 of the amplifier 1 to the second input 5 of the amplifier 1. In FIG. 1D this is the series circuit formed by the eight resistors 38 to 45. In FIG. 2D, the first resistor 10 is connected in series with the parallel circuits 22, 23, 24 of resistors. Since the resistors in the amplifier arrangement in accordance with FIG. 2D can be designed to be smaller than the resistors in the amplifier arrangement in accordance with FIG. 1D, the area requirement for the realization of the resistors in the amplifier arrangement in accordance with FIG. 2D is smaller despite the larger number of resistors in the amplifier arrangement in accordance with FIG. 2D.

In order to achieve a small relative variation of the gain factor in an amplifier arrangement in accordance with prior art FIG. 1D, the input resistor 30 and the feedback resistor 45 have to be chosen to be relatively large. They therefore have to be chosen to be large in order to achieve a small variation of the relative gain factor even in the case where there are only two resistors used.

The amplifier arrangement in accordance with FIG. 2D has at least eight resistors through which current flows during operation. The number of resistors increases further as a result of switching on the further fourth parallel circuit 23 and the fourth parallel circuit 22 and the first resistor 10.

From a predeterminable quantity for the relative variation of the gain factor, a very small area of the resistor can advantageously be chosen on account of the four resistors in the further fourth parallel circuit 24 and the four resistors in the first parallel circuit 7.

Consequently, given the same relative variation of the gain factor G, the area required for the two resistor networks is advantageously smaller in the case of the amplifier arrangement in accordance with FIG. 2D than in the case of the amplifier arrangement in accordance with FIG. 1D.

If the area for the resistor networks is predetermined, then it is possible, in accordance with the amplifier arrangement of FIG. 2D, to achieve a smaller relative variation of the gain factor compared with the relative variation of the gain factor in the amplifier arrangement in accordance with prior art FIG. 1D.

In an alternative embodiment (not shown), the second parallel circuit 11 may be provided instead of the first resistor 10, said second parallel circuit being shown in an exemplary embodiment in FIG. 2B.

Figure 3A:
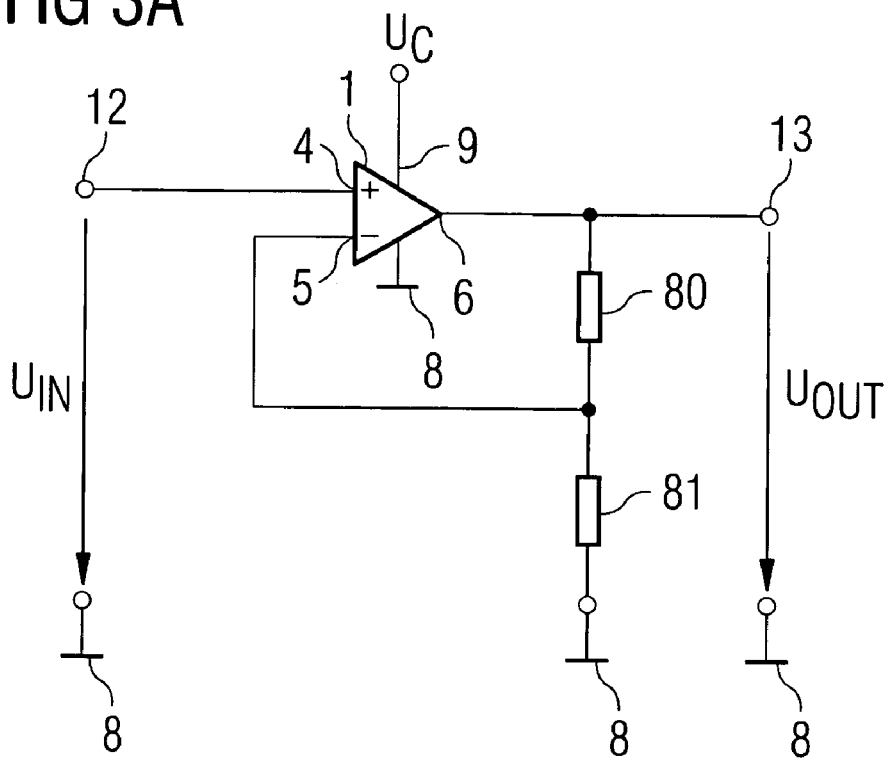
Figure 3B:
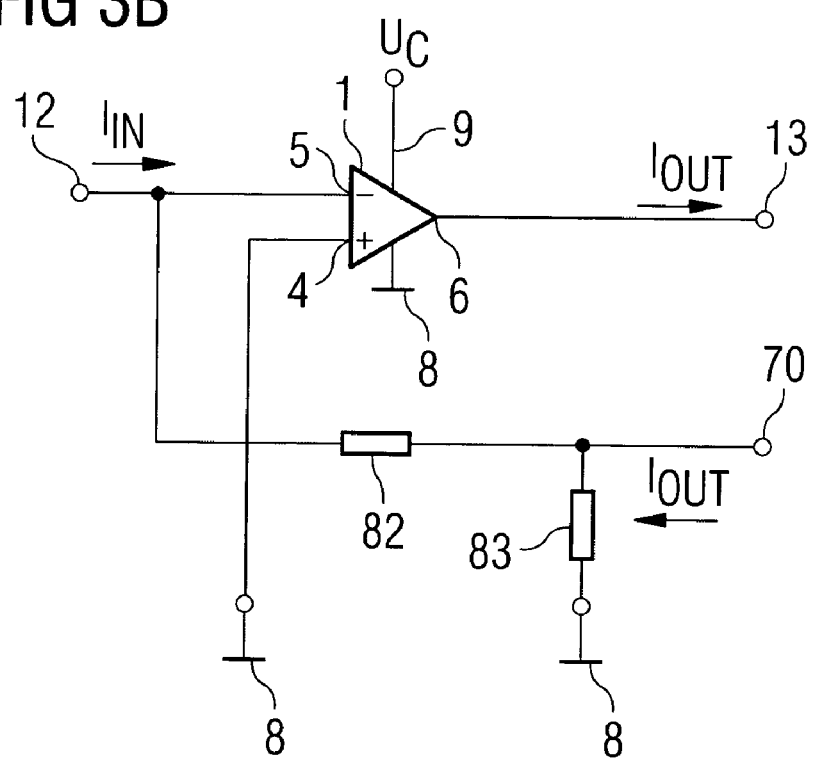

FIGS. 3A to 3C show further amplifier arrangements in which a first resistor network 2 and a second resistor network 3 may likewise be provided in accordance with another embodiment of the invention. Functionally or operatively identical structural elements bear identical reference symbols.

FIG. 3A shows a noninverting amplifier arrangement comprising an amplifier 1. The amplifier 1 comprises a first input 4, which is formed as a noninverting input, and a second input 5, which is formed as an inverting input. The amplifier 1 outputs a voltage to an output 6. The amplifier 1 is connected to a supply potential terminal 9 and a reference potential terminal 8, so that a supply voltage $U_C$ can be provided thereto.

In this noninverting amplifier arrangement, the first input 4 of the amplifier is connected to an input 12 of the amplifier arrangement. A signal to be amplified, an input voltage $U_{IN}$, is fed in at the input 12 of the amplifier arrangement. The output 6 of the amplifier 1 is connected to the reference potential terminal 8 via a series circuit, comprising a resistor 80 and a resistor 81. The series circuit comprising the resistor 80 and the resistor 81 can be replaced by a series circuit formed by the first resistor network 2 and the second resistor network 3 as are shown in the exemplary embodiments of FIGS. 2A to 2D.

A node formed between the resistor 80 and the resistor 81 or between the first resistor network 2 and the second resistor network 3 is connected to the second input 5 of the amplifier 1. The resistor 80, 81 may be formed as a resistor network 2, 3. In this case, the resistor 80 may be realized as the first resistor network 2 and the resistor 81 may be realized as the second resistor network 3. However, it is also possible for the resistor 80 to be realized as the second resistor network 3 and the resistor 81 to be realized as the first resistor network 2.

The output 6 of the amplifier 1 is connected to an output 13 of the amplifier arrangement, at which an amplified signal, an output voltage $U_{OUT}$, can be tapped off.

A gain factor G of an amplifier arrangement in accordance with FIG. 3A is calculated approximately in accordance with the following equation:

$$G = \frac{U_{OUT}}{U_{IN}} = 1 + \frac{R_{80}}{R_{81}},$$

where $R_{80}$ is the value of the resistor 80, $R_{81}$ is the value of the resistor 81, $U_{OUT}$ is the output voltage, $U_{IN}$ is the input voltage and G is the gain factor.

The gain factor G of the amplifier arrangement in accordance with FIG. 3A can be switched by switches as are shown in FIGS. 2C and 2D.

Advantages which occur as a result of the arrangement of the resistors in accordance with the present invention in the case of inverting amplifier arrangements likewise apply correspondingly to the noninverting amplifier arrangement shown in FIG. 3A and to the current-to-current amplifier arrangement shown in FIG. 3B and to the differential amplifier arrangement shown in FIG. 3C.

By dividing the resistors into resistors connected in parallel, with a predetermined relative variation of the gain factor, an amplifier arrangement in accordance with FIG. 3A also requires a smaller area for the resistor networks 2, 3 compared with a conventional embodiment.

If the area for the resistors is the predetermined variable, then it is possible, in accordance with the amplifier arrangement in FIG. 3A and an incorporation of the first resistor network 2 and, respectively, the second resistor network 3, to achieve a smaller relative variation of the gain factor compared with known amplifier arrangements.

FIG. 3B shows a current-to-current amplifier arrangement, in which a first and a second resistor network 2, 3 in accordance with FIGS. 2A to 2D may be provided for realizing a resistor 82 and a resistor 83.

The current $I_{IN}$ to be amplified is fed in at the input 12 of the amplifier arrangement. The amplified current $I_{OUT}$ is output at the output 13 of the amplifier arrangement. The amplified current $I_{OUT}$ is to be fed back to the amplifier arrangement at a further output of the amplifier arrangement 70. The input 12 of the amplifier arrangement is connected to the second terminal 5 of the amplifier 1. The output 6 of the amplifier 1 is connected to the output 13 of the amplifier arrangement. The amplifier 1 is linked to the reference potential terminal 8 at its first input 4.

The amplifier 1 is likewise linked to the reference potential terminal 8 at its second input 5 via a series circuit, comprising the resistor 82 and the resistor 83. A node formed between the resistor 82 and the resistor 83 is connected to the second output of the amplifier arrangement 70. Instead of the resistor 82 and the resistor 83 it is possible to use a first resistor network 2 and, respectively, a second resistor network 3 in accordance with the amplifier arrangements shown in FIGS. 2A to 2D.

A gain factor $G_I$, in this case the ratio of the output current $I_{OUT}$ to the input current $I_{IN}$, is produced approximately using the following equation:

$$G_I = \frac{I_{OUT}}{I_{IN}} = -1 - \frac{R_{82}}{R_{83}},$$

where $R_{82}$ is the value of the resistor 82 and $R_{83}$ is the value of the resistor 83.

A small variation of the gain factor can advantageously be achieved in an amplifier arrangement in accordance with FIG. 3B.

FIG. 3C shows an exemplary embodiment of a differential amplifier arrangement, in which a first and a second resistor network 2, 3 in accordance with FIGS. 2A to 2D may be provided for realizing four resistors 84, 85, 86, 87.

The differential amplifier arrangement may also be referred to as a subtracting amplifier arrangement.

The amplifier 1 is connected at its second output 5, via a resistor 84, to the input 12 of the amplifier arrangement for feeding in a signal to be amplified, the input voltage $U_{IN}$. The second input 5 of the amplifier 1 is furthermore connected to the output 6 of the amplifier 1 via a resistor 85. The amplifier 1 is linked at its output 6 to the output 13 of the amplifier arrangement for outputting the amplified signal, the output voltage $U_{OUT}$.

The amplifier 1 is connected at its first input 4, via a resistor 86, to a second input 71 of the amplifier arrangement for feeding in a further input voltage $U_{IN2}$. The first input 4 of the amplifier 1 is furthermore connected to the reference potential terminal 8 by means of a resistor 87.

The resistor 86 can be replaced by an exemplary embodiment of a first resistor network 2 from FIGS. 2A to 2D and the resistor 87 can correspondingly be replaced by a second resistor network 3. In the amplifier arrangement in accordance with FIG. 3C, the gain factor G is a function of the ratio of the resistor 86 to the resistor 87.

The gain factor G in the amplifier arrangement in accordance with FIG. 3C is likewise a function of the ratio of the resistor 84 to the resistor 85. Therefore, the resistor 84 and the resistor 85 can be realized by the first resistor network 2 and, respectively, the second resistor network 3 of FIGS. 2A to 2D. Both combinations are possible: the resistor 84 may be replaced by the first resistor network 2 and the resistor 85 by the second resistor network 3. Conversely, however, the resistor 84 may also be embodied by the second resistor network 3 and the resistor 85 by the first resistor network 2.

The corresponding combinations are also possible for the two resistors 86 and 87.

If the resistor 84 and the resistor 86 or the resistor networks that replace them have the same nominal value and if the resistor 85 and the resistor 87 or the resistor networks that replace them have the same nominal value, then a simple, approximately applicable equation is produced for the gain factor G:

$$G = \frac{U_{OUT}}{U_{IN} - U_{IN2}} = -\frac{R_{85}}{R_{84}}$$

In this equation, $U_{IN}$ is the input voltage, $U_{IN2}$ is the further input voltage, $U_{OUT}$ is the output voltage, $R_{85}$ is the value of the resistor 85, or the value of the resistor 87, $R_{84}$ is the value of the resistor 84, or the value of the resistor 86.

By dividing the resistors into small resistors connected in parallel, it is possible to achieve a very small relative variation of the gain factor G compared with an amplifier arrangement in which the resistors are not replaced by parallel circuits of resistors.

Figure 4A:
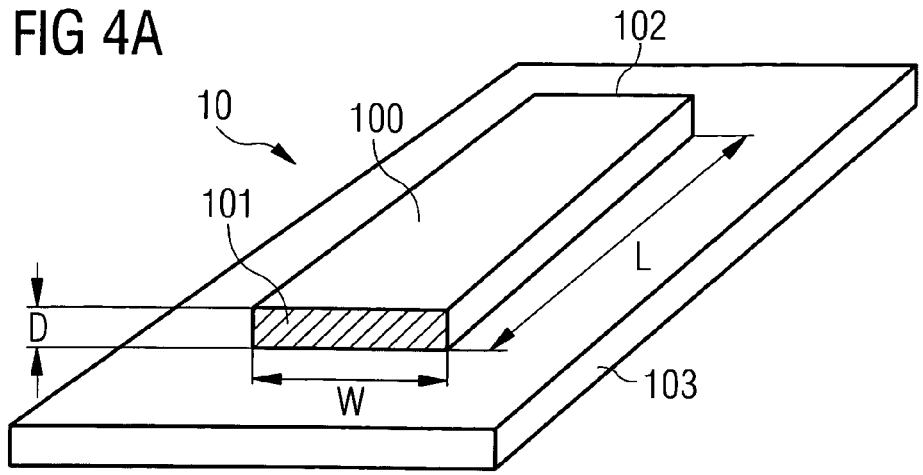
FIGS. 4A to 4C show exemplary embodiments of a resistor according to one embodiment of the invention.
Figure 4B:
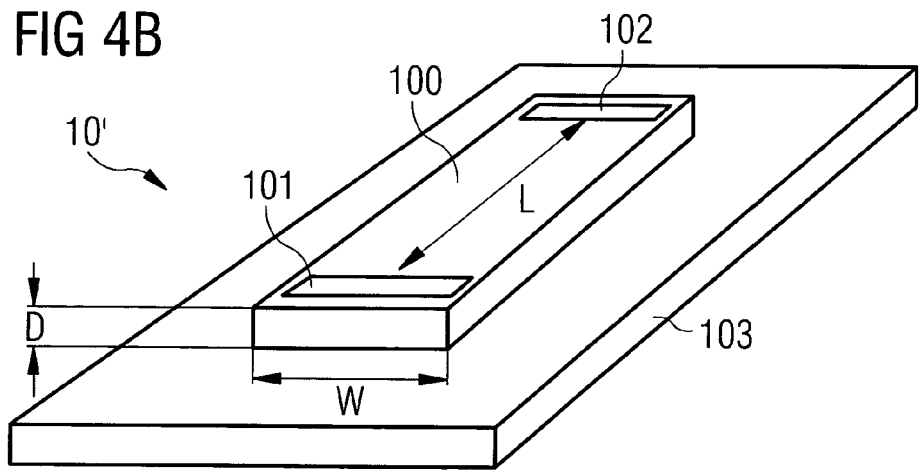
Figure 4C:
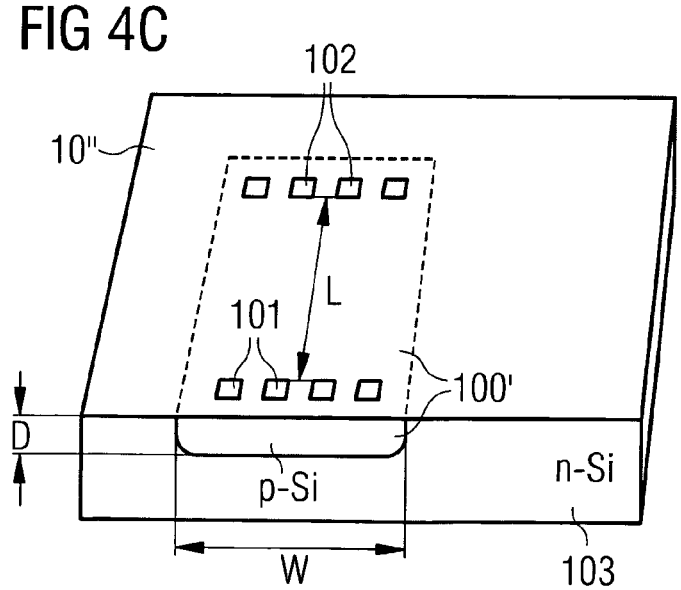

FIGS. 4A to 4C show exemplary embodiments of a resistor as may be provided in the first and second resistor networks 2, 3. The exemplary embodiments show the resistor 10 in each case. This resistor is shown as an example also for the resistors provided in the first, second, third and fourth parallel circuits 7, 11, 14 to 16, 22 to 24.

FIG. 4A shows a semiconductor body 103, onto which a resistive layer 100 is deposited. The resistor 10 comprises the resistive layer 100. The resistive layer 100 is contact-connected at a first terminal 101 and at a second terminal 102. The resistive layer 100 and thus the resistor 10 comprise a length L, a width W and a thickness D. Current flows in the resistive layer 100 from the first to the second terminal 101, 102.

The resistive layer 100 may comprise for example a metal such as aluminum or copper, a silicide, a salicide or a semiconductor such as silicon or polysilicon.

FIG. 4B shows another exemplary embodiment of the resistor 10'. In contrast to the resistor 10 in FIG. 4A, the resistor 10' in FIG. 4B is contact-connected by means of a first and a second terminal 101, 102 arranged on a main area of the resistive layer 100 which is parallel to a main area of the semiconductor body 103. In this case, the length L is the distance between the first terminal 101 and the second terminal 102.

FIG. 4C shows a further exemplary embodiment of a resistor 10″. Here, the resistor 10″ is formed as a diffused resistor in the semiconductor body 103. The semiconductor body 103 comprises n-doped silicon as material, while the resistive layer 100′ and thus the resistor 10″ comprise p-doped silicon. The resistive layer 100′ is contact-connected at a plurality of contact locations which form the first terminal 101, and at further contact locations which form the second terminal 102. The distance between the first terminal 101 and the second terminal 102 has the length L. The diffused resistor comprises a thickness D and a width W.

In an alternative embodiment (not shown), the semiconductor body 103 comprises p-doped silicon, while the resistive layer 100′ and thus the resistor 10″ comprises n-doped silicon.

The semiconductor body 103 in FIGS. 4A to 4C may comprise (not depicted in the Figures) the further resistors, the amplifier 1 and the switches.

Figure 5A:
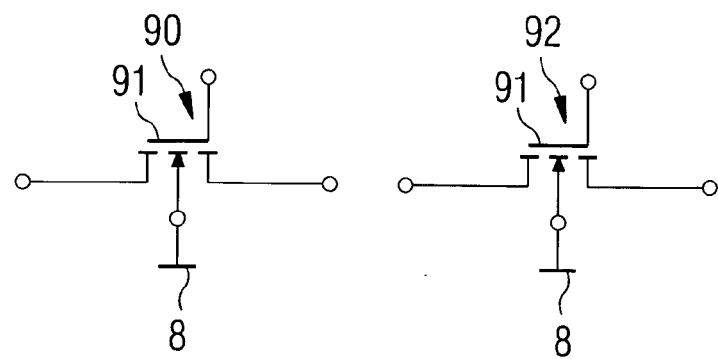
FIGS. 5A and 5B show exemplary embodiments of a switch according to another embodiment of the invention.
Figure 5B:
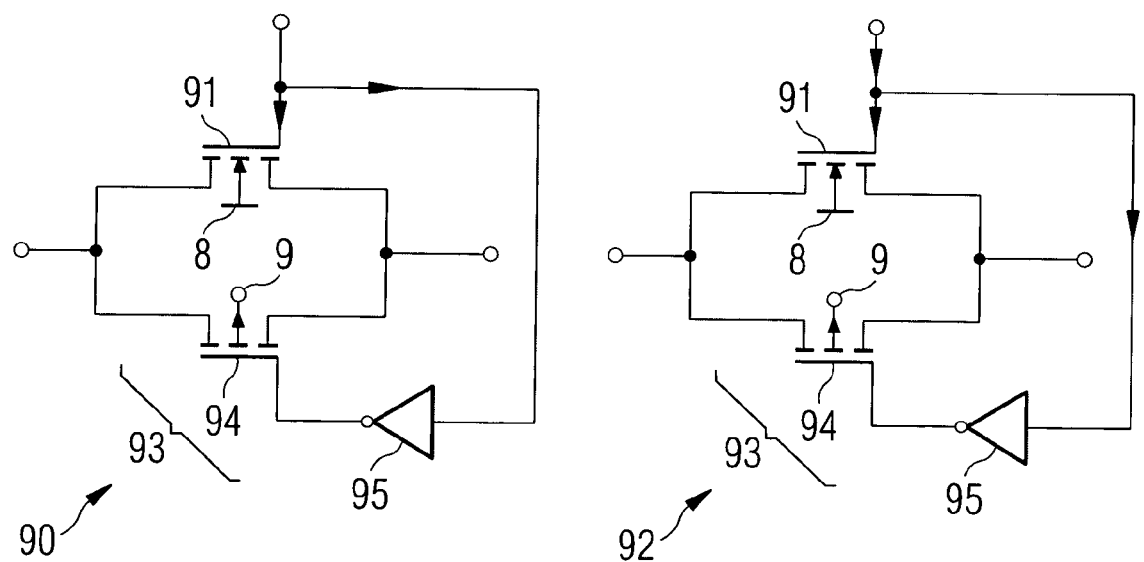

FIGS. 5A and 5B show exemplary embodiments of a switch as may be provided in the first and second resistor networks 2, 3. The switch in FIGS. 5A and 5B is realized as a semiconductor switch 90, 92.

FIG. 5A shows two exemplary embodiments of the semiconductor switch 90, 92, which in each case comprise an n-channel metal oxide semiconductor field effect transistor 91, abbreviated to MOS field effect transistor.

As an alternative, the semiconductor switches 90, 92 may comprise p-channel MOS field effect transistors.

FIG. 5B shows two exemplary embodiments of the semiconductor switch 90, 92, which in each case comprise a transmission gate 93. The transmission gate 93 in each case comprises an n-channel MOS field effect transistor 91, a p-channel MOS field effect transistor 94 and an inverter 95. A control terminal of the semiconductor switch 90, 92 is connected to a control terminal of the n-channel MOS field effect transistor 91 and, via the inverter 95, to the p-channel MOS field effect transistor 94. A first terminal of the n-channel MOS field effect transistor 91 is connected to a first terminal of the p-channel MOS field effect transistor 94. A second terminal of the n-channel MOS field effect transistor 91 is likewise connected to a second terminal of the p-channel MOS field effect transistor 94. Switches with particularly low forward resistances can be realized by means of the transmission gate 93.

In one embodiment, the amplifier arrangement comprises the amplifier, comprising the first and second inputs and also the output. The first input is embodied as a noninverting input and the second input is embodied as an inverting input. A voltage at the output of the amplifier is a function of a difference between a voltage at the first input of the amplifier and a voltage at the second input of the amplifier. The amplifier arrangement proposed furthermore comprises the first and second resistor networks. The first resistor network is formed from the first parallel circuit formed by a first number N of resistors. The second resistor network is formed from the first resistor or the second parallel circuit formed by a second number M of resistors.

Connecting the first number N of resistors in parallel is to be understood to mean that the first terminals of the first number N of resistors are connected to one another and that the second terminals of the first number N of resistors are connected to one another. This likewise applies to the further parallel circuits.

In one embodiment, the resistors of the first and second resistor networks each comprise the same nominal value.

The first resistor network has a first total resistance value $R_1$ and the second resistor network has a second total resistance value $R_2$. In one embodiment, the amplifier is coupled to the first and second resistor networks in such a way that the gain factor G is preferably a function of the ratio of the first total resistance value $R_1$ and the second total resistance value $R_2$.

The amplifier arrangement thus comprises at least one parallel circuit of resistors having the same nominal value. A resistor of the first resistor network can therefore be realized on an area which is a factor of N smaller than an area of a resistor which comprises the resistance value of the entire first resistor network, that is to say comprises the first total resistance value $R_1$. The parallel circuit of resistors having the same nominal value for forming the first and/or second resistor network may make it possible to realize resistors having a small area.

While the absolute values of the resistors may indeed have a high variation, the ratio of the value of a resistor to the value of a further resistor exhibits a lower variation. If a value σ is assumed for the variation of the ratio of two resistors, then the variation of the ratio of a first number N of resistors to a resistor is approximately only a quantity $\sqrt{N}\cdot\sigma$. This results from the fact that the variation of the ratio of values of a plurality of resistors may approximately be assumed to be uncorrelated.

For a simplified explanation it is assumed that, in one embodiment, the first resistor network comprises the first number N of resistors connected in parallel and the second resistor network comprises a first resistor, all the resistors having the same nominal value R. Preferably, the first total resistance value $R_1$ is thus R/N, while the second total resistance value $R_2$ is equal to R. The ratio of the second total resistance value $R_2$ to the first total resistance value $R_1$ thus has the value N and a variation $\sqrt{N}\cdot\sigma$. The relative variation of the ratio of the second total resistance value $R_2$ to the first total resistance value $R_1$, that is to say the variation of said ratio divided by said ratio, is thus approximately $\sqrt{N}\cdot\sigma/N$ and thus less than σ.

One advantage of this embodiment of the amplifier arrangement is that by dividing the resistors into small resistors, the relative variation of the ratio of the second total resistance value $R_2$ to the first total resistance value $R_1$ can be kept small.

The variation of the ratio of two resistors having the same nominal value and likewise having an identical length L and an identical width W may approximately be described by the following equation:

$$\sigma = \frac{k}{\sqrt{W \cdot L}},$$

where σ is the variation of the ratio, k is a constant having an exemplary value of 1.7%/μm for a given integration technique and a state of a process, W is the width and L is the length of a resistor. The product of the length L and the width W specifies the area required by the resistor.

The relative variation of the ratio of the second total resistance value $R_2$ to the first total resistance value $R_1$ may be prescribed as a value in a specification. By assuming values for the number of resistors connected in parallel, it is possible to calculate a tolerable variation for the ratio of two resistors having the same nominal value. Given a known value for the constant k, the area of a resistor may thereby be able to be specified. This produces a further advantage of one of the embodiments of the amplifier arrangement, namely that by dividing resistors into resistors connected in parallel and having the same nominal value, it is possible to obtain resistor networks having a smaller area requirement compared with known resistor networks.

In one embodiment, the resistors comprise the same construction. In a preferred embodiment, the resistors have the same construction and approximately identical dimensions. In one embodiment, a length L and a width W of a resistive layer of the resistors are approximately identical. In one embodiment, the resistive layer has an approximately identical thickness D.

In one embodiment, the resistors which contribute to the first total resistance value $R_1$ and to the second total resistance value $R_2$ are produced by means of the same production steps. By means of the same production steps means production in an identical process cycle.

In one embodiment, the resistors may be realized as correspondingly connected field effect transistors. The resistors advantageously comprise the same number of field effect transistors in each case. A field effect transistor may be embodied as a metal oxide semiconductor field effect transistor, abbreviated to MOS field effect transistor. The channel structures of the MOS field effect transistors advantageously comprise approximately the same width W and the same length L. The resistors may be formed as p-channel MOS field effect transistors. As an alternative, the resistors may be formed as n-channel MOS field effect transistors.

In another embodiment, the resistors may comprise a conductive plastic as resistance material. The resistors made of plastic advantageously have approximately the same length L and the same width W. The plastic preferably has the same thickness D.

In a further embodiment, the resistors may be embodied as cermet resistors. Cermet resistors are formed from chromium silicon oxide Cr—Si oxide. They are generally deposited by reactive sputtering. A temperature coefficient of close to zero can be achieved by a forming gas heat treatment at a temperature of approximately 300° C. In an alternative embodiment, the resistors comprise nickel-chromium as resistance material. The cermet or nickel-chromium resistors may approximately comprise the same width W and the same length L. The resistors may furthermore comprise the same thickness D. One advantage of an embodiment as cermet and nickel-chromium resistors is that the temperature coefficient of these resistors can be set to be very small in comparison with resistors made of other metals.

In an alternative embodiment, the resistors may be produced from metal as resistive material, such as aluminum with additions of silicon and/or copper, gold with an adhesion layer, titanium, tantalum, molybdenum, tungsten, nickel or platinum. The resistors advantageously comprise approximately the same width W and the same length L; it is furthermore preferred for the resistor thickness D of the resistors to be identical. One advantage of gold as resistance material is that gold is a very inert material and cannot be oxidized.

In one embodiment, the resistors are produced from aluminum and comprise the same length L and the same width W. Moreover, it is further preferred for the aluminum resistors to comprise the same thickness D. In another embodiment, the resistors may be realized from copper. In this case, too, it is preferred for the copper resistors to comprise approximately the same width W and the same length L. The copper resistors furthermore preferably comprise the same thickness D. Aluminum or copper is advantageously provided as resistance material because these metals are available in standard process sequences of semiconductor technology.

In another embodiment, the resistors are realized as diffused resistors. In this case, the substrate in a semiconductor body is suitably redoped by doping. The resistive tracks are thus insulated from the rest of the semiconductor body by a pn junction. A resistive track may be situated at the surface of the semiconductor body. As an alternative, after multiple doping operations it may be situated in the monocrystalline semiconductor body and be surrounded by a pn junction on all sides. The diffused resistors preferably comprise approximately the same width W and the same length L. Moreover, it is further preferred for a doping profile of the resistors to be approximately identical.

In another embodiment, the resistors comprise silicides or salicides. Salicides may be formed on the basis of cobalt, nickel, palladium, platinum or alternatively titanium. Silicides may be formed with transition metals and comprise molybdenum silicide $MoSi_2$, titanium silicide $TiSi_2$, tungsten silicide $WSi_2$, tantalum silicide $TaSi_2$ or alternatively cobalt silicide $CoSi_2$. The silicide or salicide resistors preferably comprise approximately the same length L and the same width W.

In one embodiment, the resistors comprise polysilicon as resistive material. The resistors may be formed from p-doped polysilicon. As an alternative, the resistors are formed from n-doped polysilicon. The polysilicon resistors preferably comprise the same width W and approximately the same length L. It is further preferred for the polysilicon resistors to comprise the same thickness D of the resistance material. Moreover, it is furthermore preferred for the polysilicon resistors to comprise the same dopant concentration.

In one embodiment, a polysilicon resistor may be connected with a contact terminal at one end and a further contact terminal at a second end. In an alternative embodiment, a polysilicon resistor may be contact-connected at the end with a first array of contact terminals and at the further end with a second array of contact terminals. Resistors advantageously have the same number of contact terminals at the first end and at the second end of the polysilicon resistor. The contact terminals advantageously comprise the same geometrical arrangement and size.

In another embodiment, a salicide or a silicide may be deposited above a polysilicon track. In a further embodiment, the salicide is exclusively provided at the ends of the polysilicon resistor.

Since the gain factor G depends on the ratio of the second total resistance value $R_2$ to the first total resistance value $R_1$, a temperature coefficient of an individual resistor has virtually no influence on the temperature coefficient of the gain factor G and the gain factor G is advantageously approximately temperature-independent.

The amplifier may be an operational amplifier, a power amplifier or a comparator.

In one embodiment, the first and second resistor networks may be realized by means of thin-film or thick-film technology. A semiconductor body, a glass body or a ceramic body may be used as carrier. The amplifier may be integrated in hybrid fashion with the first and second resistor networks.

In another embodiment, the first and second resistor networks and the amplifier may be realized using one semiconductor integration technique. A semiconductor integration technique may be a field effect transistor technology, bipolar technology or a mixed technology.

In one embodiment, the resistors of the first and second resistor networks may be individual resistors that are linked by conductor tracks.

In one embodiment, the switches may be constructed and designed identically. In another embodiment, the switches may be designed differently. In one development, the switches may be adapted in terms of their forward resistance such that they cause a relative error of identical magnitude in the gain factor G. The switch may comprise a semiconductor switch in one embodiment. The semiconductor switch may comprise a field effect transistor in one embodiment.

In another embodiment, the semiconductor switch may comprise a transmission gate. The transmission gate may comprise two field effect transistors which are of different conductivity types and the controlled paths of which are connected in parallel. The transmission gate may comprise an inverter in order that a control signal that is forwarded to the p-channel field effect transistor is inverted with respect to a control signal that is forwarded to the n-channel field effect transistor.

In addition, while a particular feature or aspect of the invention may have been disclosed with respect to only one of several implementations, such feature or aspect may be combined with one or more other features or aspects of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

The invention claimed is:

1. An amplifier arrangement comprising a first and a second resistor network comprising:
    an amplifier comprising a first input, a second input and an output,
    the first resistor network, comprising a first parallel circuit formed by a first number N of resistors, and
    the second resistor network, comprising a first resistor or a second parallel circuit formed by a second number M of resistors,
        wherein the resistors of the first and second resistor networks each comprise approximately the same nominal value, an approximately identical width W and an approximately identical length L of a resistive layer, and wherein the first and second resistor networks are coupled to the amplifier,
    wherein the second resistor network comprises at least one fourth parallel circuit which comprise a fourth number P of resistors that is connected in series with the first resistor or the second parallel circuit,
    wherein the first resistor or the second parallel circuit is connected at its first terminal to a first terminal of the second resistor network by means of a third switch, and
    wherein the at least one fourth parallel circuit is connected at its first terminal to the first terminal of the second resistor network by means of at least one fourth switch and is coupled at its second terminal to a second terminal of the second resistor network.

2. The amplifier arrangement of claim 1, wherein the first input of the amplifier comprises a noninverting input and the second input of the amplifier comprises an inverting input.

3. The amplifier arrangement of claim 1, wherein the first resistor network comprises a first total resistance value R1 and the second resistor network comprises a second total resistance value R2, and wherein the first and second resistor networks are coupled to the amplifier in such a way that the gain factor is set in a manner dependent on a ratio of the second total resistance value R2 to the first total resistance value R1.

4. The amplifier arrangement of claim 1, wherein the second resistor network comprises the following branches connected in parallel with one another:
    a series circuit branch comprising a first switch and the first resistor or the second parallel circuit, and
    at least one further series circuit branch comprising at least one second switch and at least one third parallel circuit formed by a third number L of resistors.

5. The amplifier arrangement of claim 4, wherein the first and the at least one second switch in each case comprises a semiconductor switch.

6. The amplifier arrangement of claim 1, wherein the third and the at least one fourth switch in each case comprises a semiconductor switch.

7. The amplifier arrangement of claim 1, wherein the amplifier arrangement is integrated on a semiconductor body.

8. The amplifier arrangement of claim 7, wherein the first and second resistor networks comprise diffused resistors which are diffused into the semiconductor body and are n-doped or p-doped.

9. The amplifier arrangement of claim 1, wherein the first and second resistor networks comprise resistors produced by means of a semiconductor integration technique.

10. The amplifier arrangement of claim 1, wherein the first and second resistor networks comprise resistors comprising an approximately identical thickness D of the resistive layer.

11. The amplifier arrangement of claim 10, wherein the first and second resistor networks comprise resistors each comprising the resistive layer, comprising n-doped polysilicon or p-doped polysilicon or aluminum or copper.

12. The amplifier arrangement of claim 2, wherein the amplifier arrangement is configured as an inverting amplifier, and comprises:
    wherein the first resistor network couples an input of the amplifier arrangement to the second input of the amplifier, and
    wherein the second resistor network couples the output of the amplifier to the second input of the amplifier, and
    wherein an output of the amplifier arrangement is coupled to the output of the amplifier and the first input of the amplifier is coupled to a reference potential terminal.

13. An amplifier arrangement comprising a first and second resistor network comprising:
    an amplifier comprising a first input, a second input and an output,
    the first resistor network comprising a first parallel circuit formed by a first number N of resistors and comprising a first total resistance value R1, and
    the second resistor network comprising a first resistor or a second parallel circuit formed by a second number M of resistors and also comprising a switch and comprising a second total resistance value R2,
    wherein the resistors of the first and second resistor networks each comprises approximately the same nominal value and the first and second resistor networks are coupled to the amplifier,
    wherein the second resistor network comprise at least one fourth parallel circuit which comprise a fourth number P of resistors that is connected in series with the first resistor or the second parallel circuit, wherein the first resistor or the second parallel circuit is connected at its first terminal to a first terminal of the second resistor network by means of a third switch, and wherein the at least one fourth parallel circuit is connected at its first terminal to the first terminal of the second resistor network by means of at least one fourth switch and is coupled at its second terminal to a second terminal of the second resistor network.

14. The amplifier arrangement of claim 13, wherein the first input of the amplifier comprises a noninverting input and the second input of the amplifier comprises an inverting input.

15. The amplifier arrangement of claim 13, wherein the first and second resistor networks are coupled to the amplifier in such a way that the gain factor is set in a manner dependent on a ratio of the second total resistance value R2 to the first total resistance value R1.

16. The amplifier arrangement of claim 13, wherein the second resistor network comprises the following branches connected in parallel with one another:
a series circuit branch comprising a first switch and the first resistor or the second parallel circuit, and
at least one further series circuit branch comprising at least one second switch and at least one third parallel circuit formed by a third number L of resistors.

17. The amplifier arrangement of claim 16, wherein the first and the at least one second switch in each case comprise a semiconductor switch.

18. The amplifier arrangement of claim 13, wherein the third and the at least one fourth switch in each case comprise a semiconductor switch.

19. The amplifier arrangement of claim 13, wherein the semiconductor switch comprises a field effect transistor.

20. The amplifier arrangement of claim 13, wherein the semiconductor switch comprises a transmission gate.

21. The amplifier arrangement of claim 14, wherein the amplifier arrangement is configured as an inverting amplifier comprises:
the first resistor network coupling an input of the amplifier arrangement to the second input of the amplifier,
the second resistor network coupling the output of the amplifier to the second input of the amplifier, and
wherein an output of the amplifier arrangement is coupled to the output of the amplifier and the first input of the amplifier is coupled to a reference potential terminal.

22. The amplifier arrangement of claim 14, wherein the amplifier arrangement is configured as a noninverting amplifier, and comprises the first resistor network and the second resistor network forming a series circuit that couples the output of the amplifier to a reference potential terminal, and an input of the amplifier arrangement is coupled to the first input of the amplifier, an output of the amplifier arrangement is coupled to the output of the amplifier, and a node present between the first resistor network and the second resistor network is coupled to the second input of the amplifier.

23. The amplifier arrangement of claim 14, wherein the amplifier arrangement is configured as a current/current amplifier, and comprises the first resistor network and the second resistor network forming a series circuit that couples the second input of the amplifier to a reference potential terminal, and an input of the amplifier arrangement is coupled to the second input of the amplifier, an output of the amplifier arrangement is coupled to the output of the amplifier and a node arranged between the first resistor network and the second resistor network is coupled to a further output of the amplifier arrangement and the first input of the amplifier is coupled to the reference potential terminal.

24. The amplifier arrangement of claim 14, wherein the amplifier arrangement is configured as a differential amplifier, and comprises:
a further first resistor network comprising a same interconnection and comprising components having the same nominal values as the first resistor network, and
a further second resistor network comprising a same interconnection and comprising components having the same nominal values as the second resistor network,
wherein the first resistor network couples an input of the amplifier arrangement to the second input of the amplifier,
wherein the second resistor network couples the output of the amplifier to the second input of the amplifier,
wherein the further first resistor network couples a further input of the amplifier arrangement to the first input of the amplifier,
wherein the further second resistor network couples the first input of the amplifier to a reference potential terminal, and
wherein an output of the amplifier arrangement is coupled to the output of the amplifier.

25. An amplifier arrangement, comprising:
an amplifier,
a first resistor network, comprising a first parallel circuit formed by a first number N of resistors, and
a second resistor network, comprising a first resistor or a second parallel circuit formed by a second number M of resistors,
wherein the resistors of the first and second resistor networks comprise an approximately identical width W and an approximately identical length L of a resistive layer, and wherein the first and second resistor networks are coupled to the amplifier to set the gain factor of the amplifier arrangement,
wherein the amplifier arrangement is configured as an inverting amplifier, and comprises:
the first resistor network coupling an input of the amplifier arrangement to the second input of the amplifier, and
the second resistor network coupling the output of the amplifier to the second input of the amplifier,
wherein an output of the amplifier arrangement is coupled to the output of the amplifier and the first input of the amplifier is coupled to a reference potential terminal.

26. The amplifier arrangement of claim 25, wherein the first and second resistor networks comprise resistors comprising an approximately identical thickness D of the resistive layer.

27. The amplifier arrangement of claim 25, wherein the resistors of the first and second resistor networks each comprise approximately the same nominal resistance value.

28. The amplifier arrangement of claim 25, wherein the second resistor network comprises the following branches connected in parallel with one another:
a series circuit branch comprising a first switch and the first resistor or the second parallel circuit, and
at least one further series circuit branch comprising at least one second switch and at least one third parallel circuit formed by a third number L of resistors.

29. An amplifier arrangement, comprising:
an amplifier,
a first resistor network, comprising a first parallel circuit comprising a first number N of resistors resulting in a first total resistance value R1, and a second resistor network, comprising a first resistor or a second parallel circuit comprising a second number M of resistors resulting in a second total resistance value R2, wherein the first and second resistor networks are coupled to the amplifier in such a way that a gain factor of the amplifier arrangement is set in a manner dependent on a ratio of the second total resistance value R2 to the first total resistance value R1, wherein the amplifier arrangement is configured as an inverting amplifier, and comprise:

the first resistor network that couples an input of the amplifier arrangement to the second input of the amplifier, and the second resistor network that couples the output of the amplifier to the second input of the amplifier, and wherein an output of the amplifier arrangement is couples to the output of the amplifier and the first input of the amplifier is coupled to a reference potential terminal.

30. The amplifier arrangement of claim 29, wherein the resistors of the first and second resistor networks comprise an approximately identical width W, an approximately identical length L and also an approximately identical thickness D of the resistive layer, and each comprise approximately the same nominal resistance value.

31. The amplifier arrangement of claim 29, wherein the second resistor network comprises the following branches connected in parallel with one another:

a series circuit branch comprising a first switch and the first resistor or the second parallel circuit, and at least one further series circuit branch comprising at least one second switch and at least one third parallel circuit formed by a third number L of resistors.

32. The amplifier arrangement of claim 29, wherein the second resistor network comprises at least one fourth parallel circuit which comprises a fourth number P of resistors, and which is connected in series with the first resistor or the second parallel circuit, wherein the first resistor or the second parallel circuit is connected at its first terminal to a first terminal of the second resistor network by means of a third switch, and wherein the at least one fourth parallel circuit is connected at its first terminal to the first terminal of the second resistor network by means of at least one fourth switch and is coupled at its second terminal to a second terminal of the second resistor network.

* * * * *

UNITED STATES PATENT AND TRADEMARK OFFICE
CERTIFICATE OF CORRECTION

| | | |
|---|---|---|
| PATENT NO. | : 7,423,481 B2 | Page 1 of 1 |
| APPLICATION NO. | : 11/436805 | |
| DATED | : September 9, 2008 | |
| INVENTOR(S) | : Dias da Fonte et al. | |

It is certified that error appears in the above-identified patent and that said Letters Patent is hereby corrected as shown below:

Column 19, claim 29, line 11; please replace "comprise" with --comprises--
Column 19, claim 29, line 16; please replace "couples" with --coupled--

Signed and Sealed this

Thirtieth Day of December, 2008

JON W. DUDAS
*Director of the United States Patent and Trademark Office*